United States Patent [19]

Thomas

[11] 4,335,450
[45] Jun. 15, 1982

[54] NON-DESTRUCTIVE READ OUT FIELD EFFECT TRANSISTOR MEMORY CELL SYSTEM

[75] Inventor: Donald R. Thomas, Westford, Vt.

[73] Assignee: International Business Machines Corporation, Armonk, N.Y.

[21] Appl. No.: 116,736

[22] Filed: Jan. 30, 1980

[51] Int. Cl.³ ............................................. G11C 11/40
[52] U.S. Cl. ..................................... 365/182; 365/184
[58] Field of Search ................ 365/182, 184, 189, 230

[56] References Cited

U.S. PATENT DOCUMENTS

| | | | |
|---|---|---|---|
| 3,387,286 | 6/1968 | Dennard | 365/182 |
| 3,811,076 | 5/1974 | Smith | 317/235 |
| 3,841,926 | 10/1974 | Garnache | 317/235 |
| 3,971,055 | 7/1976 | Arai | 365/182 |
| 3,986,180 | 10/1976 | Cade | 357/41 |
| 4,105,475 | 10/1976 | Jenne | 365/182 |
| 4,161,741 | 7/1979 | Collet et al. | 357/41 |
| 4,163,985 | 8/1979 | Schuemeyer | 365/182 |

OTHER PUBLICATIONS

IBM Tech. Dis. Bul., vol. 21, No. 6, Nov. 1978, pp. 2329-2330, "Sciyli Electrode VMOS RAM", by I. T. Ito et al.

"Multilevel RAM Using One Transistor Per Cell", by R. A. Heald et al. in *IEEE Journal of Solid-State Circuits*, vol. SC-11, No. 4, Aug. 1976, pp. 519-528.

*Primary Examiner*—Terrell W. Fears
*Attorney, Agent, or Firm*—Stephen J. Limanek

[57] ABSTRACT

A non-destructive read out memory cell system is provided having a semiconductor substrate supporting an array of memory cells each of which includes a field effect transistor having a source and a drain defining a channel region having high and low threshold sections. In a first embodiment the channel region is further defined by the upper surface of the semiconductor substrate, and in second and third embodiments the channel region is further defined by a V-groove and by a U-groove, respectively, formed in the substrate. A gate electrode separated from the surface of the semiconductor substrate by a thin insulating layer is disposed over the channel region. A storage node, preferably an N+ diffusion region, is located within the substrate adjacent to the high threshold section of the channel region. Pulsing means are provided for selectively charging and discharging the storage node and sensing means are provided to determine the flow of current passing through the channel region, which is representative of the binary information contained on the storage node.

19 Claims, 7 Drawing Figures

NON-DESTRUCTIVE READ OUT FIELD EFFECT TRANSISTOR MEMORY CELL SYSTEM

TECHNICAL FIELD

This invention relates to integrated semiconductor memory circuits and more particularly to memory circuits which employ a single device or transistor for storing binary digits of information.

BACKGROUND ART

Integrated semiconductor memory circuits, particularly those employing cells which include essentially a single switch or transistor and a storage capacitor have achieved high memory cell densities. One of the simplest circuits for providing small memory cells, which are now conventional, is described in commonly assigned U.S. Pat. No. 3,387,286, filed July 14, 1967 by R. H. Dennard. Each of these cells employs a storage capacitor and a field effect transistor acting as a switch to selectively connect the capacitor to a bit/sense line. In also commonly assigned U.S. Pat. Nos. 3,811,076 by W. M. Smith and 3,841,926 by R. H. Garnache and W. M. Smith, both filed Jan. 2, 1973, there is disclosed a one device field effect transistor memory cell of the type described in the above-identified Dennard patent which is made to a small size by utilizing a layer of doped polysilicon and an N+ diffusion region in a P-type semiconductor substrate separated by a dielectric medium disposed on the surface of a semiconductor substrate for forming a storage capacitor. The polysilicon layer is connected to a source of fixed or bias potential and the N+ diffusion region receives a quantity of charge dependent upon the voltage applied to a bit/sense line through a field effect transistor.

To further reduce the size of memory cells, commonly assigned U.S. patent application Ser. No. 036,722 filed by I. T. Ho and J. Riseman on May 7, 1979 and IBM Technical Disclosure Bulletin, Vol. 21, No. 6 November 1978, pp. 2329–2330, by I. T. Ho, J. Riseman and H. N. Yu disclose memories having a V- or U-groove with source and drain diffusions disposed at the surface of the substrate, with inversion storage, and U.S. Pat. No. 4,105,475, filed Oct. 1, 1976, discloses a one device memory cell having a V-groove below which is disposed a buried storage node, with a bit line diffusion at the surface of the substrate.

Commonly assigned U.S. Pat. No. 3,986,180, filed by P. E. Cade on Sept. 22, 1975, teaches a memory system utilizing a junction field effect transistor (JFET) wherein the storage capacitor is formed between a word line and a channel region. U.S. Pat. No. 3,971,055, filed Aug. 21, 1974, discloses an analog memory circuit employing a JFET wherein the channel between the source and drain is controlled by a depletion layer produced by the stored charge in a PN junction, and U.S. Pat. No. 4,161,741, filed July 11, 1977, also discloses a JFET memory wherein information stored at a floating gate between two main electrode regions is read out non-destructively.

In U.S. Pat. No. 4,163,985, filed Sept. 30, 1977, there is disclosed a non-volatile memory cell that has a buried N+ layer from which charge is injected into the insulator of an N channel metal nitride oxide semiconductor type device.

In an article entitled "Multilevel Random-Access Memory Using One Transistor Per Cell" by R. A. Heald and D. A. Hodges, *IEEE Journal of Solid-State Circuits,* Vol. SC-11, No. 4, August 1976, pp. 519–528, there is disclosed a multilevel non-destructive read out memory cell using a JFET with a surface gate and a buried floating gate controlling the resistance of the channel which extends between source and drain diffusions located at the surface of the substrate.

DISCLOSURE OF INVENTION

It is an object of this invention to provide an improved non-destructive read out random access memory system having small cells.

It is another object of this invention to provide an improved non-destructive read out random access memory system which does not require complex isolation structures between adjacent cells.

It is still another object of this invention to provide an improved non-destructive read out random access memory system having small cells which may be fabricated by a simple process.

It is a further object of this invention to provide an improved non-destructive read out random access memory system having small cells, each of which produces a larger sense signal than does a cell in a conventional one device memory cell system.

It is still a further object of this invention to provide an improved non-destructive read out random access memory system having small cells from each of which information may be read out faster than from cells of a conventional one device memory cell system.

It is yet another object of this invention to provide an improved non-destructive read out random access memory system having small cells which need not be refreshed as frequently as do the cells of a conventional one device memory system.

It is yet a further object of this invention to provide an improved non-destructive read out random access memory system having small cells wherein more than one digit of binary information may be stored simultaneously within each cell.

In accordance with the teachings of this invention, a non-destructive read out memory cell system is provided having a semiconductor substrate supporting an array of memory cells each of which includes a field effect transistor having a source and a drain defining a channel region having high and low threshold sections disposed at the surface of the semiconductor substrate. A gate electrode separated from the surface of the semiconductor substrate by a thin insulating layer is disposed over the channel region. A storage node, preferably an N+ diffusion region, is located within the substrate adjacent to the high threshold section of the channel region. Voltages are selectively applied to the gate electrode and to the source and drain for charging and discharging the storage node, with the value or magnitude of the charge on the storage node varying or modulating the threshold in the high threshold section of the channel region. Sensing means are coupled to the channel region when a voltage is applied to the gate electrode to determine the flow of current passing through the channel region, which is representative of the binary information contained in the storage node.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
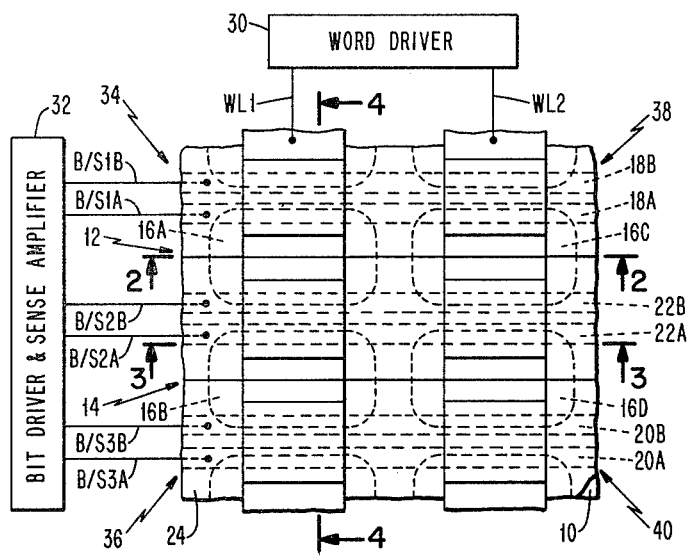
FIG. 1 is a plan view of a V-groove embodiment of the semiconductor memory system of the present invention.
Figure 4:
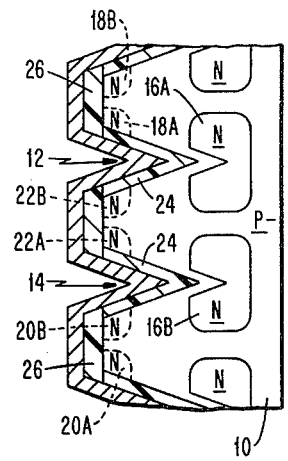
FIG. 4 is a section taken through FIG. 1 at line 4—4.
Figure 2:
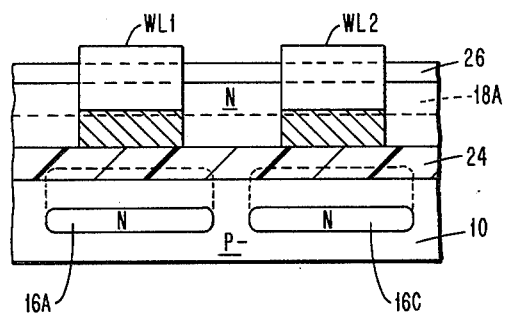
FIG. 2 is a section taken through FIG. 1 at line 2—2.
Figure 3:
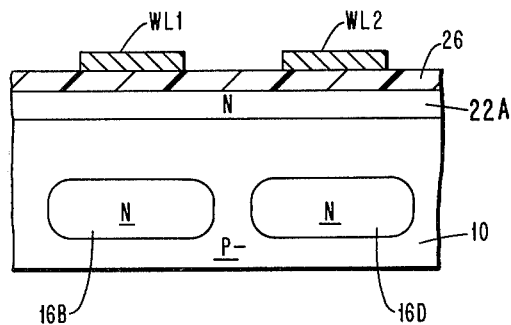
FIG. 3 is a section taken through FIG. 1 at line 3—3.

Referring to FIGS. 1, 2, 3 and 4 of the drawing in more detail, there is shown the non-destructive read out random access memory system of the present invention which includes a semiconductor substrate 10, preferably made of P— type silicon having a plurality of parallelly arranged V-grooves, such as 12 and 14, indicated more clearly in FIG. 4 of the drawings. Disposed within semiconductor substrate 10 below the apex of each of the V-grooves 12 and 14 are a plurality of storage nodes, preferably N diffusion regions, such as 16A, 16B, 16C and 16D, as seen in, e.g., FIGS. 2 and 4. N type diffusion regions are provided at the surface of substrate 10 to form drain diffusion strips 18A, 20A and 22A and source diffusion strips 18B, 20B and 22B. Drain diffusion strips 18A, 22A and 20A are connected to bit/sense lines B/S1A, B/S2A and B/S3A, respectively, and the source diffusion strips 18B, 22B and 20B are connected to bit/sense lines B/S1B, B/S2B and B/S3B, respectively.

A thin dielectric medium 24, such as silicon dioxide, is preferably grown on the surface of the V-grooves 12 and 14 and a thicker layer of insulation 26, which may also be made of silicon dioxide, is formed on the upper surface of substrate 10. Word lines WL1 and WL2 arranged parallel to each other are formed over the insulating layers 24 and 26 and are connected to a word driver 30, which may be of any conventional type. The bit/sense lines B/S1A and B/S1B, B/S2A and B/S2B and B/S3A and B/S3B are connected to a bit driver and sense amplifier 32, which also may be of any conventional type.

The memory array shown in FIGS. 1, 2, 3 and 4 illustrates essentially four cells arranged in a 2×2 array with cells 34 and 36 being aligned along word line WL1 and cells 38 and 40 being aligned along word line WL2. Each of the cells 34, 36, 38 and 40 includes essentially a field effect transistor having a storage node associated therewith. For example, the field effect transistor of cell 34 includes drain and source strips 18A and 22B defining a channel region which passes between the apex of V-groove 12 and storage node 16A. The gate electrode of the transistor of cell 34 is that portion of word line WL1 passing over thin insulator or dielectric medium 24 within V-groove 12. Cell 36 has a similar transistor and storage node 16B associated therewith, cell 38 also has a similar transistor associated with storage node 16C and cell 40 has a similar transistor and storage node 16D.

Figure 5:
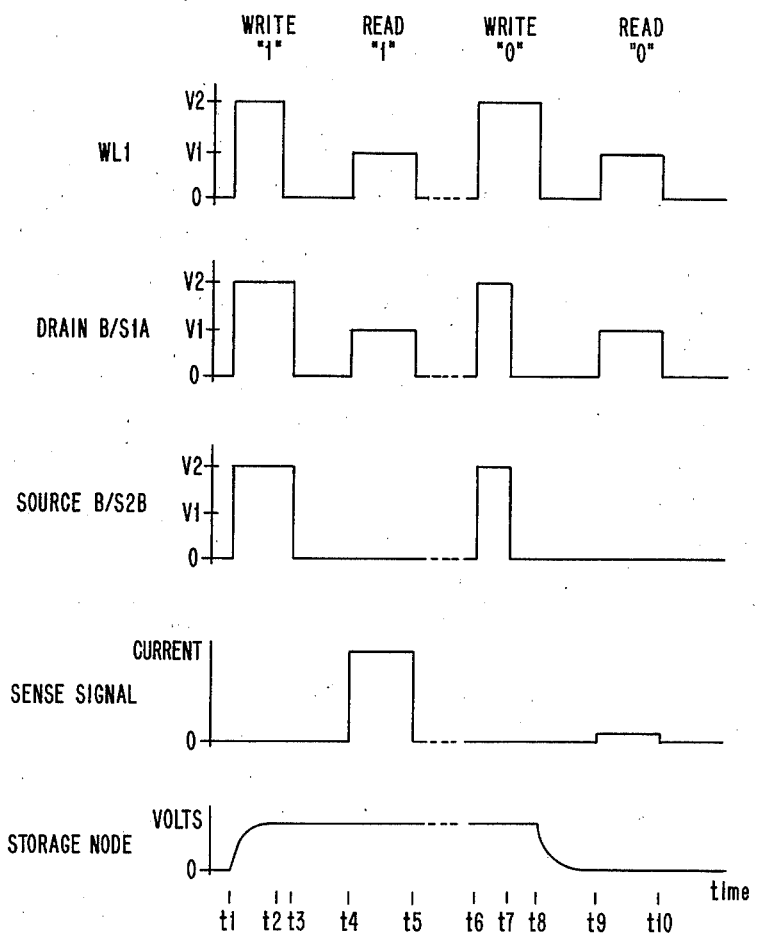
FIG. 5 is a pulse program which may be used to operate the system illustrated in FIGS. 1–4 of the drawings.

In order to better understand the operation of the invention, reference may be had to FIG. 5 of the drawing illustrating a pulse program which may be used in connection with the system of the present invention illustrated in FIGS. 1, 2, 3 and 4 of the drawing.

In order to write a 1 digit of binary information into, for example, cell 34. A voltage from word driver 30 having a magnitude of V2, as indicated in FIG. 5 of the drawing, is applied at time t1 to word line WL1 and a voltage V2 from bit driver 32 is also applied to the drain strip 18A via bit/sense line B/S1A and source strip 22B via bit/sense line B/S2B causing charge, more specifically electrons, to be drawn from storage node 16A into the channel region of the transistor of cell 34 and then into the drain and source strips 18A and 22B. At time t2 the voltage V2 on the word line WL1 is reduced to zero and a small increment of time later at t3 the voltage on the drain and source strips 18A and 22B is reduced to zero causing a positive charge to be produced on storage node 16A having a sufficient voltage magnitude, as indicated in FIG. 5 of the drawing, to deplete the section of the transistor channel region near the apex of V-groove 12 causing a substantial decrease in the threshold and, therefore, of the transistor of cell 34.

It should be understood that the section of the channel region near the apex has a higher threshold than the threshold in other sections of the channel region due to the geometry of the V-groove type transistor and, therefore, is the controlling factor in transistor conduction.

To read the stored 1 from cell 34, a voltage V1, having a magnitude substantially less than V2, as indicated in FIG. 5 of the drawing is applied to word line WL1 from word driver 30 and a voltage V1, from bit driver 32, is applied to the drain diffusion strip 18A via bit/sense line B/S1A with the source diffusion strip 22B being connected to the sense amplifier 32 via bit/sense line B/S2B. Since the storage node in cell 34 has a positive charge, the channel between drain 18A and source 22B has a reduced threshold and, therefore, a relatively large amount of current, as indicated in FIG. 5 between times t4 and t5, will flow to the sense amplifier 32, indicating that a 1 digit of binary information is stored in cell 34. The charge on storage node 16A of cell 34 is not destroyed after reading and need not be refreshed for at least several microseconds.

To write a 0 digit of binary information into cell 34, the voltage V2 from word driver 30 is again applied at time t6 to word line WL1 and the voltage V2 from bit driver 32 is also applied to the drain and source strips 18A and 22B. However, at time t7, the voltage on drain and source strips 18A and 22B is reduced to zero while voltage V2 continues to be applied to word line WL1 causing an accummulation of charge in the channel region of the transistor of cell 34. At time t8, the voltage on word line WL1 is reduced to zero and the charge in the channel region is attracted to the storage node 16A decreasing or eliminating the positive charge on storage node 16A, as indicated in FIG. 5 of the drawing between times t8 and t9.

To read the stored 0 from cell 34, the voltage V1 is applied to word line WL1 and to the drain strip 18A, with the source strip 22B being connected to the sense amplifier 32. Since the floating N diffusion region or storage node 16A has little or no charge, it does not vary or modulate the high threshold at the apex of the channel region and, therefore, little, if any, current flows through the channel region into sense amplifier 32, as illustrated in FIG. 5 between times t9 and t10, indicating that a 0 digit of binary information has been stored in cell 34. Memory cells 36, 38 and 40 are written and read in a manner similar to that described in connection with cell 34.

It should be noted that by making the voltage V2 equal to approximately +10 volts and voltage V1 equal to approximately +5 volts, currents sensed during the reading of a 1 digit may be equal to many microamperes and during the reading of a 0 digit are reduced by one to two orders of magnitude to readily distinguish between 1 and 0 digits.

It should be understood that the floating N diffusion regions or storage nodes 16A, 16B, 16C and 16D must be positioned close enough to the apex of the V-grooves 12 and 14 so that the positive charge on the storage nodes representing a 1 digit vary or modulate the entire channel region of a cell at the apex of the V-groove. The spacing between the apex of the V-groove and the storage node, such as 16A, may be, e.g., 0.8 to 1.0 micrometers. Any known technique may be used to locate the storage nodes in the proper positions within substrate 10, such as by known ion implantation techniques. Alternatively, N diffusion regions may be formed at the surface of a semiconductor substrate over which a first epitaxial layer of the semiconductor material is grown. The V-grooves are then formed through the first epitaxial layer into the N diffusion regions with a second epitaxial layer grown over the V-grooved first epitaxial layer. When a P— semiconductor substrate is used, the N diffusion material used to form the storage nodes 16A, 16B, 16C and 16D, as well as drain and source strips 18A, 18B, 20A, 20B, 22A and 22B, is preferably arsenic. It should also be understood that, if desired, the threshold of the channel regions near the apex of the V-grooves may be further increased by diffusing or implanting P type material, such as boron, into these sections of the channel regions after the V-grooves are formed.

Since the memory cells of the system of the present invention are current sensitive and since these cells hold charge for a relatively long period of time compared with conventional dynamic one device memory cells, the system of the present invention may be used for multilevel storage, i.e., more than one digit of information may be stored simultaneously in one cell. This multilevel storage may be accomplished by, e.g., writing with voltages of different magnitude, such as V2, V3 and V4, where V3 and V4 have different magnitudes greater than that of V2, to produce different magnitudes of positive voltage or potential on storage nodes 16A, 16B, 16C and 16D resulting in a like number of different current values sensed during the read operation.

Figure 6:
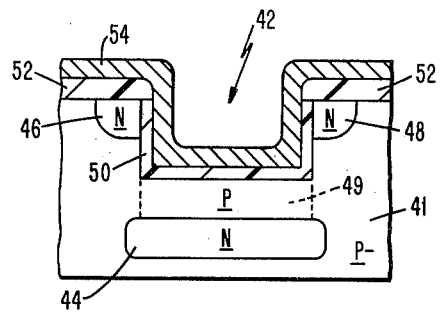
FIG. 6 is a sectional view, similar to that of FIG. 4, of a U-groove embodiment of the present invention.

The system of the present invention may take the form of another embodiment wherein each of the cells are formed in a U-groove as indicated in FIG. 6 of the drawings, which is a sectional view corresponding to the sectional view of FIG. 4 of the drawings. As shown in FIG. 6 of the drawings, the non-destructive read out U-groove type cell includes a P— type semiconductor substrate 41 having a U-groove 42 formed therein by, e.g., any dry etching technique. An N diffusion region or storage node 44 may be formed in substrate 41 by implanting arsenic through the U-groove 42 to a depth slightly below, e.g., 0.8 to 1.0 microns, the bottom of U-groove 42. Simultaneously N diffusion drain and source strips 46 and 48 may be formed at the surface of substrate 41 by, e.g., providing on the top surface of substrate 41 a material, not shown, which partially resists the penetration of the arsenic ions, such as a photo resist, into the substrate 41. By implanting boron through U-groove 42, a high threshold section 49 is formed in the channel region of the transistor at the bottom surface of the U-groove cell, with lower threshold sections of the channel region being formed by the P— substrate 41 along the vertical walls of the U-groove 42. A thin layer of silicon dioxide 50 is then grown in U-groove 42 with a thicker layer of silicon dioxide 52 formed over the upper surface of substrate 41. A word line 54, which may be made of doped polysilicon or of copper-doped aluminum, is deposited over silicon dioxide layers 50 and 52 forming a gate electrode over the thin silicon dioxide layer 50 for the transistor of the U-groove cell. This U-groove cell, when substituted for the V-groove cell in the system illustrated in FIGS. 1, 2, 3 and 4 of the drawings, operates in a similar manner as the V-groove cell.

Figure 7:
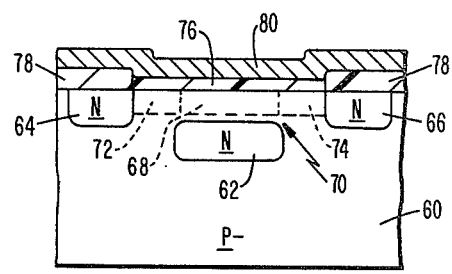
FIG. 7 is a section, similar to that of FIG. 6, of a cell having a planar configuration which may be used in the system of the present invention.

The system of the present invention may take the form of a further embodiment wherein each of the cells is formed on a planar surface of a semiconductor substrate as indicated in FIG. 7 of the drawings, which is a sectional view corresponding to the sectional views of FIGS. 4 and 6 of the drawings. As shown in FIG. 7 of the drawings, the non-destructive read out planar cell includes a P— type semiconductor substrate 60 having a N diffusion region or storage node 62 formed within and beneath the surface of substrate 60 and drain and source N diffusion strips 64 and 66, respectively, formed at the surface of substrate 60. The N diffusion regions or strips 62, 64 and 66 may be formed in any known manner, e.g., by providing an arsenic doped oxide layer followed by a photo resist layer on the surface of substrate 60 and then etching the doped oxide layer through an opening in the photo resist to produce an opening to the surface of substrate 60. Storage node 62 is then produced by implanting arsenic through the opening. Also, by implanting boron through this opening a high threshold section 68 is formed in channel region 70 which also includes lower threshold sections 72 and 74 having the P— doping of substrate 60. To form the drain and source strips 64 and 66, undercutting techniques may be employed to etch away a portion of the doped oxide from the vicinity of the high threshold section 68 before driving the arsenic from the doped oxide into substrate 60. After removing all of the photo resist and the doped oxide, a thin layer of silicon dioxide 76 is grown over the channel region 70 and a thicker layer of silicon dioxide 78 is formed over the drain and source strips 64 and 66. A word line 80 is deposited over silicon dioxide layers 76 and 78 forming a gate electrode over the thin silicon dioxide layer 76 for the transistor of the planar cell. This planar cell, when substituted for the V-groove cell in the system illustrated in FIGS. 1, 2, 3 and 4 of the drawings, operates in a similar manner as the V-groove cell.

It should be noted that in each of the above described embodiments the channel region of the cell has two different threshold voltages with the higher threshold voltage section being located nearer the storage node than is the lower threshold voltage section or sections. This arrangement of threshold sections prevents electrons from escaping into the bulk of the semiconductor substrate when the voltage on the gate electrode is reduced to zero volts during the write 0 operation of the cells to inject electrons into the storage node from the channel regions of the cells. It should also be noted that techniques other than those described herein may be used to provide high and low thresholds, e.g., as is known, the thin insulating layer between the gate electrode and the channel region may be a stepped oxide having two or more different thicknesses.

Several embodiments of the memory system of the present invention have been disclosed hereinabove, which relate primarily to changes in geometry but it should be understood that additional embodiments may also fall within the teachings of this invention with changes made to other elements of the system. For example, the diffusion strips 22A and 22B, as seen more clearly in FIG. 4 of the drawings, may be combined to form a common source diffusion strip with diffusion strip 18A acting as a drain diffusion for cells 34 and 38 and diffusion strip 20B acting as a drain diffusion for cells 36 and 40.

Although only a 2×2 array or matrix of cells has been illustrated in the drawings in the interest of clarity, it should be understood that many more cells may be arranged along each of the word lines and that many more word lines may be provided in the system of the present invention.

It should also be understood that although the system has been described in connection with the use of a P type substrate, an N type substrate may also be used with corresponding changes in polarity in the system, as is known.

It can be seen that in accordance with the teachings of this invention, a non-destructive read out random access memory system having small cells is provided which does not require a complex six-sided isolation structure between adjacent cells to prevent charge contamination. Also, it should be noted that the cells of this system require fewer space-consuming contacts and gates than do other non-destructive read out random access memory systems.

While the invention has been particularly shown and described with reference to preferred embodiments thereof, it will be understood by those skilled in the art that various changes in form and details may be made therein without departing from the spirit and scope of the invention.

What is claimed is:

1. A non-destructive read out memory cell system comprising:
    a semiconductor substrate of a given type conductivity,
    a field effect transistor having source and drain regions of a conductivity opposite to said given type conductivity defining a channel region having first and second threshold sections disposed within said semiconductor substrate and a gate electrode isolated from said channel region,
    a storage node region having said opposite type conductivity disposed within said substrate adjacent to the first threshold section of said channel regions,
    means coupled to said gate electrode and to said source and drain regions for selectively charging and discharging said storage node region, and
    means for indicating the flow of current passing through said channel region.

2. A non-destructive read out memory cell system as set forth in claim 1 wherein said channel region is formed at the surface of said semiconductor substrate, said first and second threshold sections are high and low threshold sections, respectively.

3. A non-destructive read out memory cell system as set forth in claim 2 wherein said semiconductor substrate includes a groove further defining said channel region and said storage node region is disposed near the lowest point of said groove in said semiconductor substrate.

4. A non-destructive read out memory cell system as set forth in claim 3 wherein said groove is in the form of a V-groove and said storage node region is disposed near the apex of said V-groove.

5. A non-destructive read out memory cell system as set forth in claim 3 wherein said groove is in the form of a U-groove and said storage node is disposed near the bottom surface of said U-groove.

6. A non-destructive read out memory cell system as set forth in claim 5 wherein said high threshold section of said channel region is disposed between said storage node region and the bottom surface of said U-groove.

7. A non-destructive read out memory cell system as set forth in claim 3 wherein said groove is in the form of a V-groove and the high threshold section of said channel region is disposed between said storage node region and the apex of said V-groove.

8. A non-destructive read out memory cell system as set forth in claim 2 wherein high threshold section of said channel region is disposed substantially midway between said source and drain regions.

9. A non-destructive read out memory cell system as set forth in claim 2 wherein said low threshold section includes first and second segments and said high threshold section is disposed between said first and second segments.

10. A memory system comprising
    a semiconductor substrate of a given type conductivity,
    first and second diffusion regions of a conductivity opposite to said given type conductivity defining a channel region having high and low threshold sections disposed within said substrate,
    a third diffusion region having said opposite type conductivity disposed in said substrate adjacent to the high threshold section of said channel region,
    a gate electrode insulated from said channel region,
    means coupled to said gate electrode and to said first and second diffusion regions for controlling the charge on said third diffusion region, and
    means for sensing current flow through said channel.

11. A memory system as set forth in claim 10 wherein said sensing means is coupled to at least one of said first and second diffusion regions.

12. A memory system as set forth in claim 11 wherein said substrate includes a groove further defining said channel region.

13. A memory system as set forth in claim 12 wherein said third diffusion region is separated from the bottom of said groove by said channel region.

14. A memory system as set forth in claim 12 wherein said groove is a V-groove and said third diffusion region is separated from the apex of said V-groove by said channel region.

15. A memory system as set forth in claim 12 wherein said groove is a U-groove and said third diffusion is separated from the bottom surface of said U-groove by said channel region.

16. A memory system comprising
    a semiconductor substrate of a given type conductivity, a plurality of spaced apart parallelly arranged diffusion strips of a conductivity opposite to said given type conductivity disposed within said substrate, adjacent pairs of strips defining a plurality of channel regions having a high threshold section and a low threshold section, a plurality of spaced apart parallelly arranged word lines disposed over and insulated from said channel regions, said word lines being orthogonal to said diffusion strips, a plurality of discrete diffusion regions having said opposite type conductivity disposed within said semiconductor substrate, one of said plurality of discrete diffusion regions being located adjacent to the high threshold section of one of said channel regions, means coupled to said word lines and to said diffusion strips for controlling the charge on said discrete diffusion regions, and means coupled to said diffusion strips for sensing current flow through each of said channels.

17. A memory system as set forth in claim 16 wherein said diffusion strips and said word lines form field effect transistors and each of said adjacent pairs of strips includes a drain and a source.

18. A memory system as set forth in claim 16 wherein a plurality of parallelly arranged V-grooves are formed in said substrate within each of said adjacent pairs of strips to further define said channel regions, said V-grooves being orthogonal to said word lines.

19. A memory system as set forth in claim 16 wherein a plurality of parallelly arranged U-grooves are formed in said substrate within each of said adjacent pairs of strips to further define said channel regions, said U-grooves being orthogonal to said word lines.

* * * * *